United States Patent
Hwang et al.

(10) Patent No.: US 11,594,705 B2
(45) Date of Patent: Feb. 28, 2023

(54) DISPLAY APPARATUS

(71) Applicant: Samsung Display Co., Ltd., Yongin-si (KR)

(72) Inventors: Hyunmin Hwang, Yongin-si (KR); Youngmin Kim, Yongin-si (KR); Kitaek Jeong, Yongin-si (KR); Haeri Choi, Yongin-si (KR); Dongwon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/735,217

(22) Filed: Jan. 6, 2020

(65) Prior Publication Data
US 2020/0343478 A1 Oct. 29, 2020

(30) Foreign Application Priority Data
Apr. 23, 2019 (KR) .................. 10-2019-0047519

(51) Int. Cl.
*G06F 3/041* (2006.01)
*H01L 51/52* (2006.01)
(Continued)

(52) U.S. Cl.
CPC .......... *H01L 51/5253* (2013.01); *G06F 3/041* (2013.01); *G06F 3/0412* (2013.01); *H01L 27/323* (2013.01); *H01L 51/0096* (2013.01); *H01L 51/5237* (2013.01); *H01L 51/5246* (2013.01)

(58) Field of Classification Search
CPC .................. G06F 3/041; G06F 3/0412; G06F 2203/04103; G06F 2203/04111
See application file for complete search history.

(56) References Cited

U.S. PATENT DOCUMENTS

| 8,721,389 B2 | 5/2014 | Jung et al. |
| 8,721,392 B2 | 5/2014 | Brown et al. |

(Continued)

FOREIGN PATENT DOCUMENTS

| KR | 10-2011-0066326 A | 6/2011 |
| KR | 10-2014-0084919 A | 7/2014 |

(Continued)

OTHER PUBLICATIONS

U.S. Office Action dated Sep. 22, 2021, issued in U.S. Appl. No. 16/709,572 (26 pages).

*Primary Examiner* — Dennis P Joseph
(74) *Attorney, Agent, or Firm* — Lewis Roca Rothgerber Christie LLP

(57) ABSTRACT

A display apparatus may prevent a thin-film encapsulation layer and a substrate or a thin-film encapsulation layer and a buffer layer from being separated from each other when a base layer and the substrate are cut. A display apparatus may include a display panel including a substrate, a display layer on the substrate, and a thin-film encapsulation layer covering the display layer; an input sensing member including a base layer facing the substrate of the display panel, and sensing electrodes above the base layer; and a resin layer between the thin-film encapsulation layer and the base layer, and an end of the thin-film encapsulation layer protrudes from the resin layer toward an end of the substrate.

19 Claims, 17 Drawing Sheets

(51) Int. Cl.
  *H01L 51/00*  (2006.01)
  *H01L 27/32*  (2006.01)

(56) References Cited

U.S. PATENT DOCUMENTS

| | | |
|---|---|---|
| 8,854,591 B2 | 10/2014 | Liu et al. |
| 9,474,125 B2 | 10/2016 | Kim et al. |
| 9,720,268 B2 | 8/2017 | Liu et al. |
| 2002/0131008 A1 | 9/2002 | Iwase et al. |
| 2015/0097810 A1* | 4/2015 | Aoki .................... H01L 27/323 |
| | | 345/174 |
| 2017/0287992 A1 | 10/2017 | Kwak et al. |
| 2018/0013096 A1* | 1/2018 | Hamada .............. H01L 27/3276 |
| 2018/0061897 A1 | 3/2018 | Oh et al. |
| 2018/0155238 A1 | 6/2018 | Kim et al. |
| 2018/0188866 A1* | 7/2018 | Heo ................... G06F 3/04166 |
| 2018/0190734 A1* | 7/2018 | Kang ...................... B32B 15/08 |
| 2018/0307088 A1* | 10/2018 | Liu ........................ G06F 3/0412 |
| 2019/0129554 A1* | 5/2019 | Kim ........................ G06F 3/041 |
| 2019/0179466 A1 | 6/2019 | Kim et al. |
| 2020/0343478 A1 | 10/2020 | Hwang et al. |

FOREIGN PATENT DOCUMENTS

| | | |
|---|---|---|
| KR | 10-2016-0012378 A | 2/2016 |
| KR | 10-2016-0012412 A | 2/2016 |
| KR | 10-2016-0073531 A | 6/2016 |
| KR | 10-1633118 B1 | 6/2016 |
| KR | 10-2018-0077917 A | 7/2018 |
| KR | 10-1908503 B1 | 10/2018 |

\* cited by examiner

DISPLAY APPARATUS

CROSS-REFERENCE TO RELATED APPLICATION

This application claims priority to and the benefit of Korean Patent Application No. 10-2019-0047519, filed on Apr. 23, 2019 in the Korean Intellectual Property Office, the entire disclosure of which is incorporated herein by reference.

BACKGROUND

1. Field

Aspects of one or more embodiments relate to an apparatus and, more particularly, to a display apparatus.

2. Description of the Related Art

Recently, display apparatuses have been diversified in use. In addition, the thickness of the display apparatuses becomes thinner and the weight of the display apparatuses becomes lighter, and the range of use of the display apparatuses is becoming widespread. Various functions for connecting or linking to a display apparatus have been increased while enlarging the area occupied by the display area of the display apparatus.

SUMMARY

According to an aspect of one or more embodiments, a method of adding various functions while enlarging the area occupied by a display area, and a display apparatus in which unneeded portions other than a display area are removed or reduced are provided. According to another aspect of one or more embodiments, a display apparatus that is not damaged when removing the unneeded portions is provided.

Additional aspects will be set forth in part in the description which follows and, in part, will be apparent from the description, or may be learned by practice of the presented embodiments.

According to one or more embodiments, a display apparatus includes a display panel including a substrate, a display layer on the substrate, and a thin-film encapsulation layer covering the display layer; an input sensing member including a base layer facing the substrate of the display panel, and sensing electrodes above the base layer; and a resin layer between the thin-film encapsulation layer and the base layer, wherein an end of the thin-film encapsulation layer protrudes from the resin layer toward an end of the substrate.

In an embodiment, the thin-film encapsulation layer includes at least one inorganic encapsulation layer and at least one organic encapsulation layer.

In an embodiment, an end of the at least one inorganic encapsulation layer protrudes from the resin layer at the end of the substrate.

In an embodiment, the end of the thin-film encapsulation layer is in direct contact with the substrate.

In an embodiment, the display layer includes a buffer layer between the substrate and the thin-film encapsulation layer.

In an embodiment, the buffer layer includes at least one of silicon oxide and silicon nitride, and the end of the thin-film encapsulation layer is in direct contact with the at least one of silicon oxide and silicon nitride.

In an embodiment, the end of the thin-film encapsulation layer is closer to the resin layer than the end of the substrate.

In an embodiment, the substrate and the base layer include glass.

In an embodiment, a side surface of the resin layer is curved.

According to one or more embodiments, a display apparatus includes a display panel including a substrate, a display layer on the substrate, and a thin-film encapsulation layer covering the display layer; an input sensing member including a base layer facing the substrate of the display panel, and sensing electrodes above the base layer; and a resin layer between the thin-film encapsulation layer and the base layer, wherein the resin layer is located between the thin-film encapsulation layer and the base layer and exposes a portion of a surface of the thin-film encapsulation layer facing the base layer.

In an embodiment, in a plan view, an area of the resin layer is less than an area of the thin-film encapsulation layer.

In an embodiment, in a plan view, the resin layer is located inside an edge of the thin-film encapsulation layer.

In an embodiment, the end of the thin-film encapsulation layer is in direct contact with the substrate.

In an embodiment, the display layer includes a buffer layer between the substrate and the thin-film encapsulation layer.

In an embodiment, the buffer layer includes at least one of silicon oxide and silicon nitride, and the end of the thin-film encapsulation layer is in direct contact with the at least one of silicon oxide and silicon nitride.

In an embodiment, the substrate and the base layer include glass.

In an embodiment, a portion of a side surface of the resin layer between the substrate and the base layer protrudes away from the display layer.

In an embodiment, in a plan view, an area of the base layer is greater than an area of the thin-film encapsulation layer.

In an embodiment, the thin-film encapsulation layer includes at least one inorganic encapsulation layer and at least one organic encapsulation layer.

According to one or more embodiments, a display apparatus includes a display panel including a substrate, the substrate including a display area around an opening area, a display layer on the substrate, and a thin-film encapsulation layer covering the display layer; an input sensing member including a base layer facing the substrate of the display panel, and sensing electrodes above the base layer; and a resin layer between the thin-film encapsulation layer and the base layer, wherein an end of the thin-film encapsulation layer protrudes from the resin layer toward an end of the substrate.

Other aspects, features, and advantages other than those described above will become apparent from the following drawings, claims, and detailed description of the disclosure.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
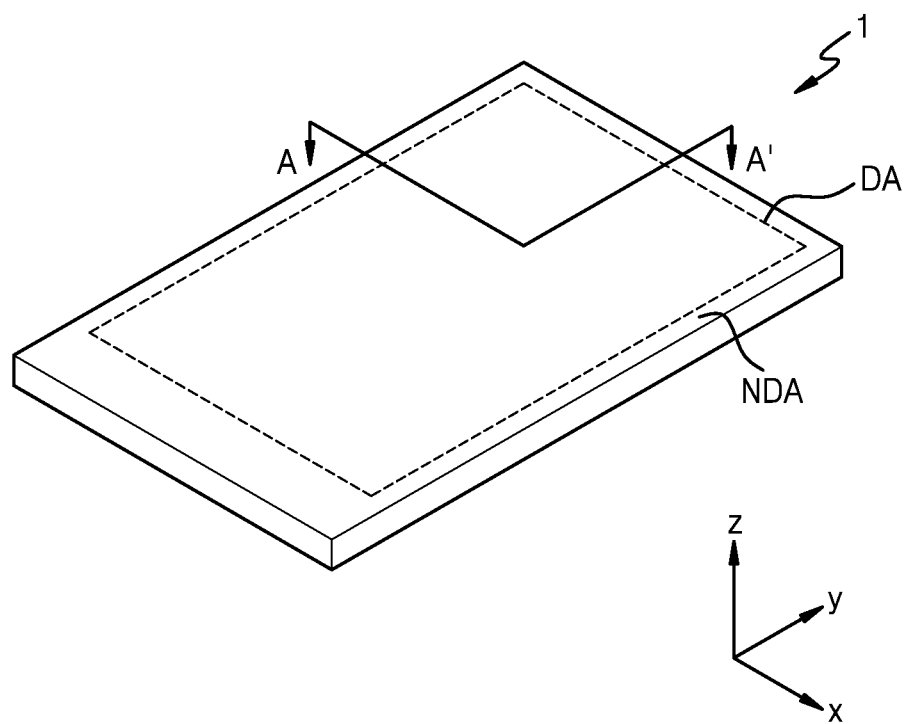
FIG. 1 is a schematic perspective view illustrating a display apparatus according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in further detail in the written description. The effects and features of the present disclosure and the methods of achieving the same will become apparent with reference to the example embodiments described in further detail below with reference to the accompanying drawings. However, the present disclosure may, however, be embodied in many different forms and should not be construed as being limited to the example embodiments set forth herein.

Herein, the present disclosure will be described in further detail by explaining some example embodiments of the present disclosure with reference to the attached drawings. Like reference numerals in the drawings denote like elements and, thus, their description may be omitted.

It is to be understood that although the terms "first," "second," etc. may be used herein to describe various components, these components should not be limited by these terms. These components are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or component is referred to as being "formed on," another layer, region, or component, it may be directly or indirectly formed on the other layer, region, or component. That is, for example, one or more intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, it is to be understood that when a layer, region, or component is referred to as being "connected to" another layer, region, or component, it may be directly or indirectly connected to the other layer, region, or component. For example, it is to be understood that when a layer, region, or component is referred to as being "connected to" another layer, region, or component, it may not only be directly electrically connected to the other layer, region, or component, but also may be indirectly electrically connected to the other layer, region, or component with one or more other layers, regions, or components interposed therebetween.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

FIG. 1 is a schematic perspective view illustrating a display apparatus 1 according to an embodiment of the present disclosure.

Referring to FIG. 1, the display apparatus 1 may include a display area DA and a non-display area NDA. The display apparatus 1 may provide images by using light emitted from pixels in the display area DA. The non-display area NDA is an area in which the pixels are not located and may surround the display area DA.

Herein, the display apparatus 1 according to an embodiment of the present disclosure is described as an organic light-emitting display apparatus as an example, but the display apparatus of the present disclosure is not limited thereto. In another embodiment, the display apparatus 1 may be any of various types of display apparatuses, such as an inorganic light-emitting display apparatus and a quantum dot light-emitting display apparatus. In some embodiments, each pixel of the display apparatus 1 may include a light-emitting layer, and the light-emitting layer may include an organic material, an inorganic material, a quantum dot, an organic material and a quantum dot, or an inorganic material and a quantum dot.

Figure 2:
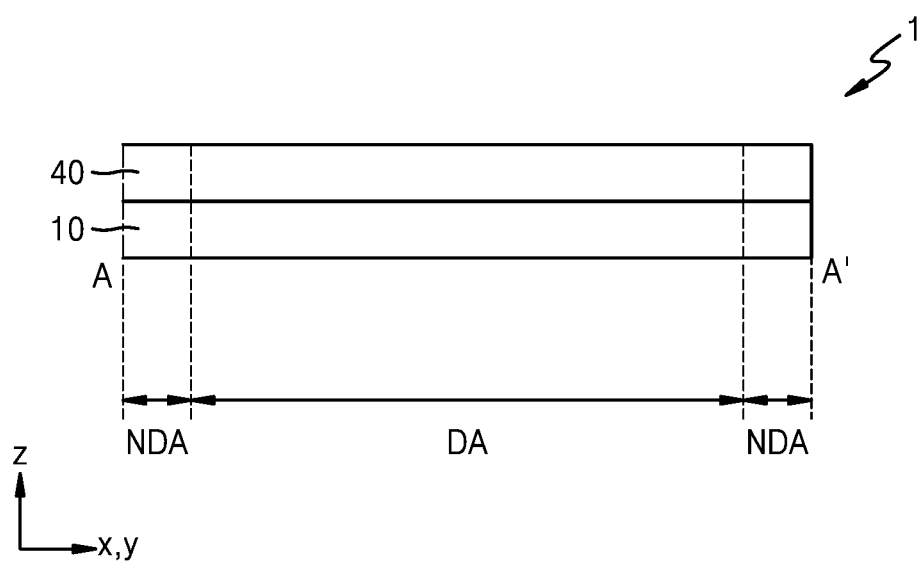
FIG. 2 is a cross-sectional view of a display apparatus according to an embodiment.

FIG. 2 is a cross-sectional view of the display apparatus 1 according to an embodiment of the present disclosure, taken along the line A-A' of FIG. 1.

Referring to FIG. 2, the display apparatus 1 may include a display panel 10 and an input sensing member 40. The display panel 10 may display an image by using the pixels in the display area DA.

The input sensing member 40 may obtain coordinate information according to an external input, for example, a touch event. The input sensing member 40 may include a sensing electrode (or touch electrode) and a trace line (or signal line) connected to the sensing electrode. The input sensing member 40 may be located on the display panel 10.

Figure 3:
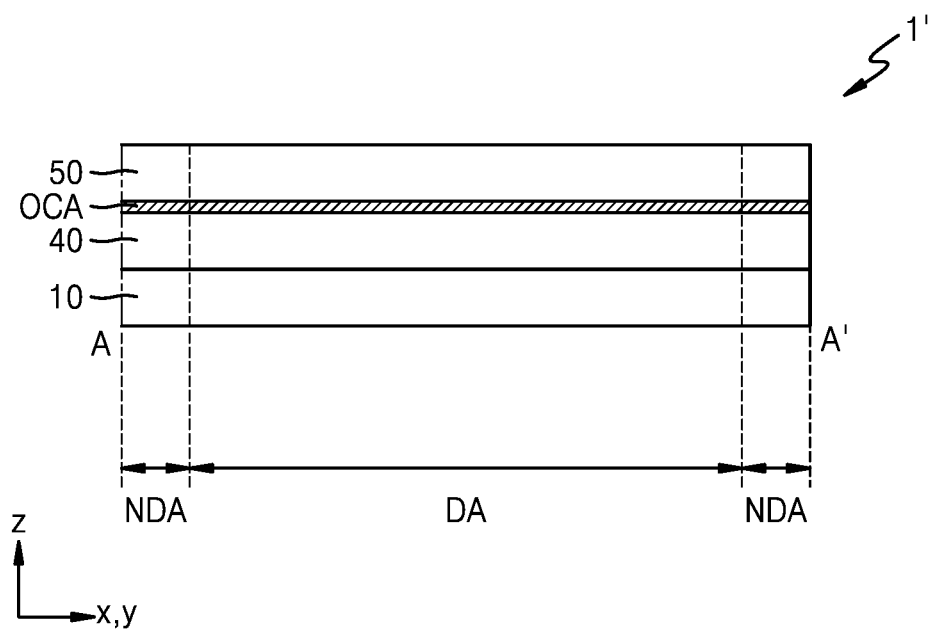
FIG. 3 is a cross-sectional view of a display apparatus according to another embodiment.

FIG. 3 is a schematic cross-sectional view illustrating a display apparatus 1' according to an embodiment of the present disclosure.

Referring to FIG. 3, the display apparatus 1' may further include an optical functional member 50 located above the input sensing member 40. The optical functional member 50 may reduce incident light (external light) from the outside toward the display panel 10 and/or improve the color purity of the light emitted from the display panel 10.

In an embodiment, the optical functional member 50 may include a retarder and a polarizer. The retarder may be a film type or a liquid crystal coating type and may include a λ/2 retarder and/or a λ/4 retarder. The polarizer may also be a film type or a liquid crystal coating type. The film type may include a stretch-type synthetic resin film, and the liquid crystal coating type may include liquid crystals in a certain arrangement. The retarder and the polarizer may further include a protective film. The retarder and the polarizer or the protective film may be defined as a base layer of the optical functional member 50.

In another embodiment, the optical functional member 50 may include a black matrix and color filters. The color filters may be arranged considering the color of light emitted from each of the pixels of the display panel 10. Each of the color filters may include pigments or dyes of red, green, or blue. In an embodiment, each of the color filters may further include a quantum dot in addition to the pigments or dyes mentioned above. In addition, some of the color filters may not include the pigments or dyes mentioned above and may include scattering particles, such as titanium oxide.

In another embodiment, the optical functional member 50 may include a destructive interference structure. The destructive interference structure may include a first reflective layer and a second reflective layer located above different layers. First reflected light and second reflected light respectively reflected from the first reflective layer and the second reflective layer may destructively interfere, and, thus, the reflectance of external light may be reduced.

In an embodiment, a process of forming the optical functional member 50 may be performed separately from a process of forming the input sensing member 40. In this case, as shown in FIG. 3, an adhesive film such as an optically clear adhesive (OCA) member OCA may be arranged between the optical functional member 50 and the input sensing member 40. In another embodiment, a process of forming the optical functional member 50 may continue after the process of forming the input sensing member 40. In this case, the adhesive film may not be arranged between the optical functional member 50 and the input sensing member 40.

Figure 4:
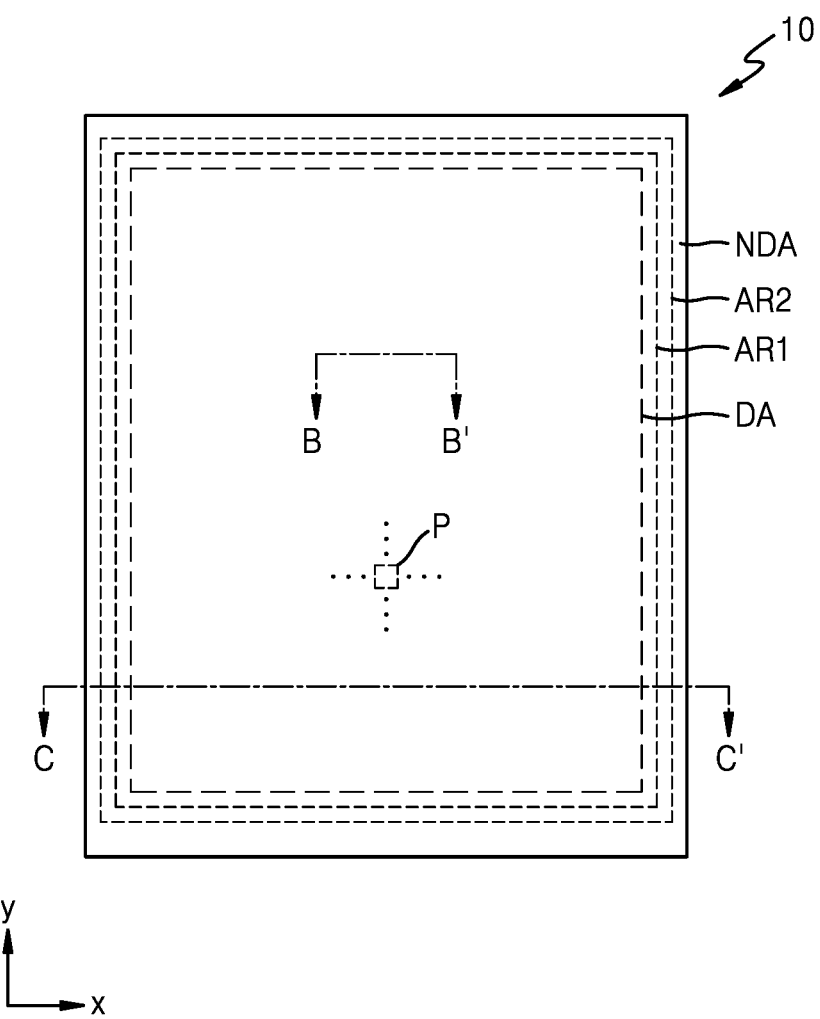
FIG. 4 is a schematic plan view illustrating a display panel according to an embodiment.

FIG. 4 is a schematic plan view illustrating the display panel 10 according to an embodiment of the present disclosure.

Referring to FIG. 4, the display panel 10 may include the display area DA and the non-display area NDA. A plurality of pixels P may be located in the display area DA. In addition, an image may be implemented in the display area DA by operating each pixel P. In an embodiment, each wiring, pad, or the like connected to the pixel P may be located in the non-display area NDA.

A first area AR1 in which a resin layer (not shown) to be described later is located and a second area AR2 in which a thin-film encapsulation layer (not shown) to be described later is located may be arranged between the non-display area NDA and the display area DA. The first area AR1 may be the same as the display area DA or greater than the display area DA. For example, in a plan view, the display area DA may be located inside the first area AR1. In this case, in a plan view, the area of the first area AR1 may be equal to or greater than the area of the display area DA. In addition, the second area AR2 may be greater than the first area AR1, and the first area AR1 may be located inside the second area AR2. In a plan view, the area of the second area AR2 may be greater than the area of the first area AR1.

As described above, in an embodiment, an edge of a substrate (not shown), the first area AR1, and the second area AR2 may completely surround the display area DA and the second area AR2 may completely surround the first area AR1. In addition, in an embodiment, the first area AR1 may completely surround the display area DA.

In addition, the first area AR1 and the second area AR2 may be smaller than a base layer (not shown) to be described later. In a plan view, the area of the base layer may be the same as or substantially similar to the area of the substrate.

Figure 5:
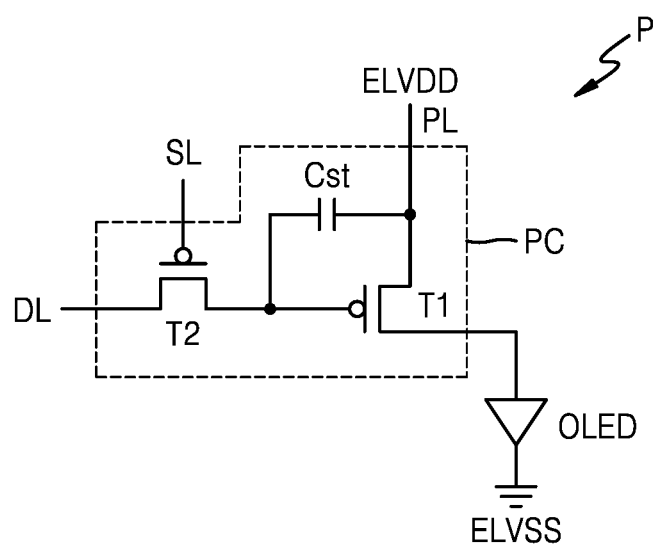
FIG. 5 is an equivalent circuit diagram of a pixel of a display panel according to an embodiment.

FIG. 5 is an equivalent circuit diagram of a pixel P of a display panel according to an embodiment of the present disclosure.

Referring to FIG. 5, each pixel P may include a pixel circuit PC and a display element connected to the pixel circuit PC, for example, an organic light-emitting diode OLED. The pixel circuit PC may include a first thin-film transistor T1, a second thin-film transistor T2, and a storage capacitor Cst. Each pixel P may emit, for example, red, green, blue, or white light through the organic light-emitting diode OLED.

The second thin-film transistor T2 is a switching thin-film transistor which may be connected to a scan line SL and a data line DL and transmit a data voltage, to the first thin-film transistor T1, input from the data line DL based on a switching voltage input from the scan line SL. The storage capacitor Cst may be connected to the second thin-film transistor T2 and a driving voltage line PL and store a voltage corresponding to the difference between a voltage received from the second thin-film transistor T2 and a first power supply voltage ELVDD supplied to the driving voltage line PL.

The first thin-film transistor T1 is a driving thin-film transistor which may be connected to the driving voltage line PL and the storage capacitor Cst and control a driving current flowing from the driving voltage line PL through the organic light-emitting diode OLED in accordance with a voltage value stored in the storage capacitor Cst. The organic light-emitting diode OLED may emit light having a certain brightness according to the driving current. An opposite electrode (e.g., a cathode) of the organic light-emitting diode OLED may receive a second power supply voltage ELVSS.

FIG. 5 illustrates that the pixel circuit PC includes two thin-film transistors and one storage capacitor, but the present disclosure is not limited thereto. The number of thin-film transistors and the number of storage capacitors may be variously changed according to a design of the pixel circuit PC. For example, the pixel circuit PC may further include four or more thin-film transistors in addition to the above-mentioned two thin-film transistors.

Figure 6:
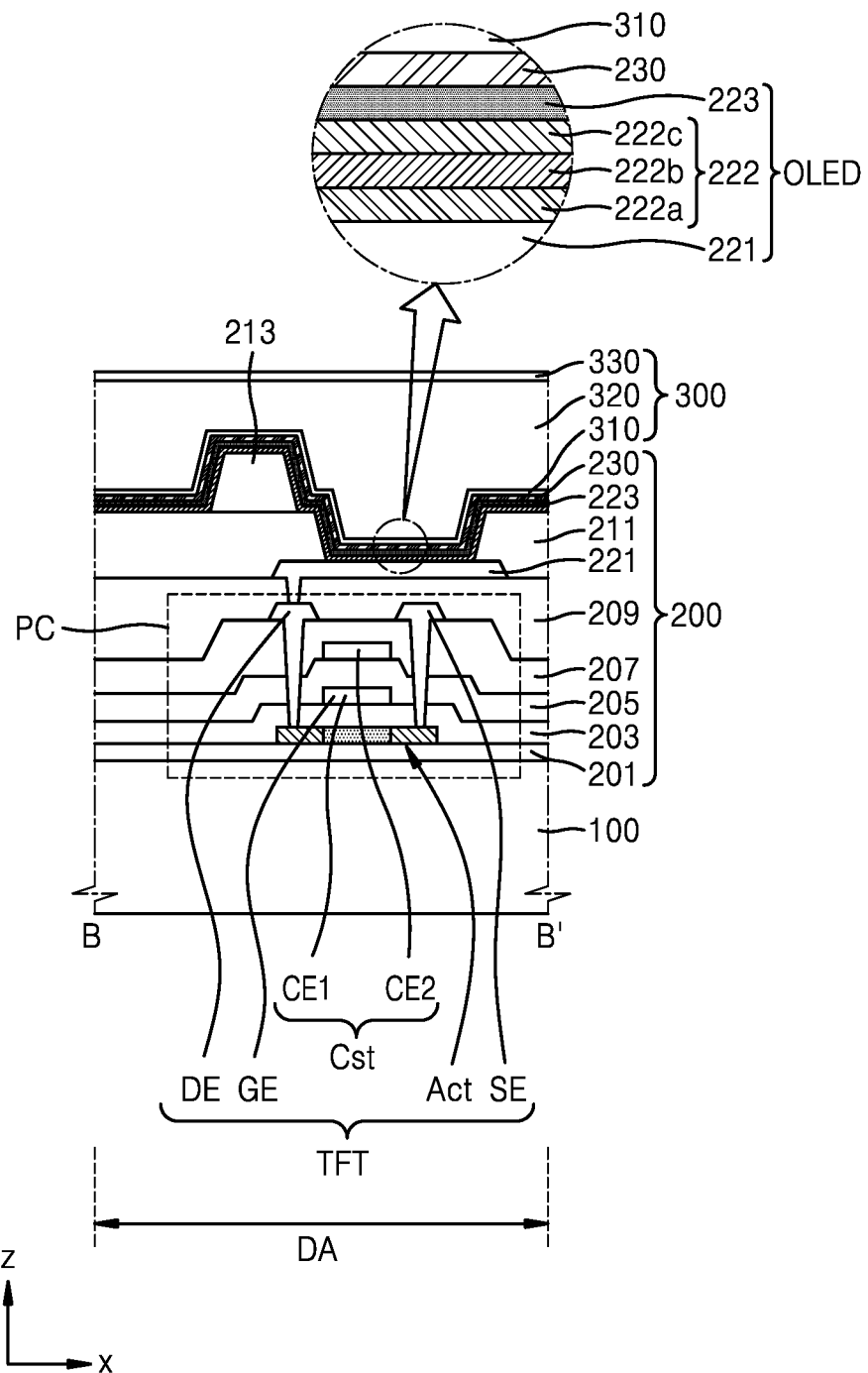
FIG. 6 is a cross-sectional view of a pixel of a display panel according to an embodiment.

FIG. 6 is a cross-sectional view of a pixel of a display panel according to an embodiment of the present disclosure, taken along the line C-C' of FIG. 4.

Referring to FIG. 6, the pixel circuit PC and the organic light-emitting diode OLED, which is a display element connected to the pixel circuit PC, are located on a substrate 100.

The substrate 100 may include a glass material or a resin material. In an embodiment, for example, the substrate 100 may include a glass substrate including $SiO_2$ as a main component.

A buffer layer 201 may be formed on the substrate 100 to prevent or substantially prevent impurities from penetrating into a semiconductor layer Act of a thin-film transistor TFT. The buffer layer 201 may include an inorganic insulating material, such as silicon nitride (SiNx) or silicon oxide (SiOx) and may be a single layer or a multilayer including the above-mentioned inorganic insulating material.

The pixel circuit PC may be located on the buffer layer 201. The pixel circuit PC may include the thin-film transistor TFT and the storage capacitor Cst. The thin-film transistor TFT may include the semiconductor layer Act, a gate electrode GE, a source electrode SE, and a drain electrode DE. In the present embodiment, a top-gate type transistor in which the gate electrode GE is above the semiconductor layer Act with a gate insulating layer 203 between the gate electrode GE and the semiconductor layer Act is shown, but, according to another embodiment, the thin-film transistor TFT may be a bottom-gate type transistor.

In an embodiment, the semiconductor layer Act may include polysilicon. In an embodiment, the semiconductor layer Act may include an amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), or the like, and may be a multilayer or a single layer including the above-mentioned material.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, hafnium oxide, or the like. The gate insulating layer 203 may be a single layer or a multilayer including the above-mentioned material.

The source electrode SE and the drain electrode DE may include a material with good conductivity. The source electrode SE and the drain electrode DE may include a conductive material including Mo, Al, Cu, Ti, or the like and may be a multilayer or a single layer including the above-mentioned material. In an embodiment, the source electrode SE and the drain electrode DE may be formed as a multilayer of Ti/Al/Ti.

The storage capacitor Cst may include a lower electrode CE1 and an upper electrode CE2 which overlap with each other, and a first interlayer insulating layer 205 may be between the lower electrode CE1 and the upper electrode CE2. In an embodiment, the storage capacitor Cst may overlap the thin-film transistor TFT. Accordingly, FIG. 6 illustrates that the gate electrode GE of the thin-film transistor TFT is the lower electrode CE1 of the storage capacitor Cst. In another embodiment, the storage capacitor Cst may not overlap the thin-film transistor TFT. The storage capacitor Cst may be covered by a second interlayer insulating layer 207.

The first interlayer insulating layer 205 and the second interlayer insulating layer 207 may include an inorganic insulating material, such as silicon oxide, silicon nitride, silicon oxynitride, aluminum oxide, titanium oxide, tantalum oxide, hafnium oxide, or the like. The first interlayer insulating layer 205 and the second interlayer insulating layer 207 may be a single layer or a multilayer including the above-mentioned material.

The pixel circuit PC including the thin-film transistor TFT and the storage capacitor Cst may be covered by a planarization insulating layer 209. An upper surface of the planarization insulating layer 209 may be substantially flat. In an embodiment, the planarization insulating layer 209 may include any of a general commercial polymer such as poly(methyl methacrylate) (PMMA) or polystyrene (PS), a polymer derivative having a phenol group, and an organic insulating material such as an acrylic polymer, an imide polymer, an aryl ether polymer, an amide polymer, a fluorine polymer, a p-xylene polymer, a vinyl alcohol polymer, and a blend thereof. In an embodiment, the planarization insulating layer 209 may include polyimide. In addition, the planarization insulating layer 209 may include an inorganic insulating material or may include an inorganic insulating material and an organic insulating material.

A pixel electrode 221 may be formed on the planarization insulating layer 209. The pixel electrode 221 may include a conductive oxide, such as an indium tin oxide (ITO), an indium zinc oxide (IZO), a zinc oxide (ZnO), an indium oxide ($In_2O_3$), an indium gallium oxide (IGO), or an aluminum zinc oxide (AZO). In another embodiment, the pixel electrode 221 may include a reflective film, the reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 may further include a film including ITO, IZO, ZnO, or $In_2O_3$ above/below the reflective film mentioned above.

A pixel defining film 211 may be formed on the pixel electrode 221. The pixel defining film 211 may include an opening exposing an upper surface of the pixel electrode 221 and may cover the edge of the pixel electrode 221. In an embodiment, the pixel defining film 211 may include an organic insulating material. In an embodiment, the pixel defining film 211 may include an inorganic insulating material, such as silicon nitride, silicon oxynitride, or silicon oxide. In an embodiment, the pixel defining film 211 may include an organic insulating material and an inorganic insulating material.

An intermediate layer 222 may include a light-emitting layer 222b. The intermediate layer 222 may include a first functional layer 222a located below the light-emitting layer 222b and/or a second functional layer 222c located on the light-emitting layer 222b. The light-emitting layer 222b may include a high-molecular-weight or low-molecular-weight organic material which emits light of a certain color.

The first functional layer 222a may be a single layer or a multilayer. For example, when the first functional layer 222a includes a high-molecular-weight material, the first functional layer 222a may be a hole transport layer (HTL) having a single-layer structure and may include poly-(3,4)-ethylene-dihydroxy thiophene (PEDOT) or polyaniline (PANI).

When the first functional layer 222a includes a low-molecular-weight material, the first functional layer 222a may include a hole injection layer (HIL) and an HTL.

The second functional layer 222c may be optionally provided. In an embodiment, when the first functional layer 222a and the light-emitting layer 222b include a high-molecular-weight material, the second functional layer 222c is formed. The second functional layer 222c may be a single layer or a multilayer. In an embodiment, the second functional layer 222c may include an electron transport layer (ETL) and/or an electron injection layer (EIL).

The light-emitting layer 222b of the intermediate layer 222 may be located for each pixel in the display area DA. In an embodiment, the first functional layer 222a and the second functional layer 222c of the intermediate layer 222 may be respectively formed as a single body to cover a plurality of pixels.

An opposite electrode 223 may include a conductive material having a low work function. For example, the opposite electrode 223 may include a (semi)transparent layer, the (semi)transparent layer including Mg, Al, Pt, Pd, Au, Ni, Nd, Ir, Cr, lithium (Li), calcium (Ca), alloys thereof, or the like. In an embodiment, the opposite electrode 223 may further include a layer such as ITO, IZO, ZnO, or $In_2O_3$ above the (semi)transparent layer including the above-mentioned material. In an embodiment, the opposite electrode 223 is a single body and may be formed not only in the display area DA but also the non-display area NDA. In an embodiment, the intermediate layer 222 and the opposite electrode 223 may be formed by thermal deposition.

In an embodiment, a spacer 213 may be formed on the pixel defining film 211. The spacer 213 may include an organic insulating material, such as polyimide. In an embodiment, the spacer 213 may include an inorganic insulating material, such as silicon nitride or silicon oxide, or may include an organic insulating material and an inorganic insulating material.

The spacer 213 may include a material different from that of the pixel defining film 211. In an embodiment, the spacer 213 may include a material that is the same as that of the pixel defining film 211. In an embodiment, the pixel defining film 211 and the spacer 213 may be formed together in a mask process using a halftone mask or the like. In an embodiment, the pixel defining film 211 and the spacer 213 may include polyimide.

A capping layer 230 may be located on the opposite electrode 223. In an embodiment, the capping layer 230 may include lithium fluoride (LiF). In an embodiment, the capping layer 230 may be omitted.

A thin-film encapsulation layer 300 is an encapsulation member and may cover the organic light-emitting diode OLED. The thin-film encapsulation layer 300 may include at least one inorganic encapsulation layer and at least one organic encapsulation layer. In an embodiment, as shown in FIG. 6, the thin-film encapsulation layer 300 may include a first inorganic encapsulation layer 310, an organic encapsulation layer 320, and a second inorganic encapsulation layer 330, which are sequentially stacked.

The first and second inorganic encapsulation layers 310 and 330 may respectively include one or more inorganic insulating materials. In an embodiment, the inorganic insulating material may include aluminum oxide, titanium oxide, tantalum oxide, hafnium oxide, zinc oxide, silicon oxide, silicon nitride, and/or silicon oxynitride. The organic encapsulation layer 320 may include a polymer-based material. In an embodiment, the polymer-based material may include any of an acrylic resin, an epoxy resin, polyimide, and polyethylene. The acrylic resin may include, for example, polymethyl methacrylate, polyacrylic acid, or the like.

As described above, a lower surface of at least one end of the first and second inorganic encapsulation layers 310 and 330 may be directly in contact with the substrate 100 or may be directly in contact with the buffer layer 201. For example, other portions, except for a portion located above a display layer (not shown) to be described later, of at least one of the first and second inorganic encapsulation layers 310 and 330 may be directly in contact with the substrate 100 or the buffer layer 201. In particular, at least one of the first and second inorganic encapsulation layers 310 and 330 may be directly in contact with the substrate 100 or the buffer layer 201 in the non-display area NDA.

Figure 7:
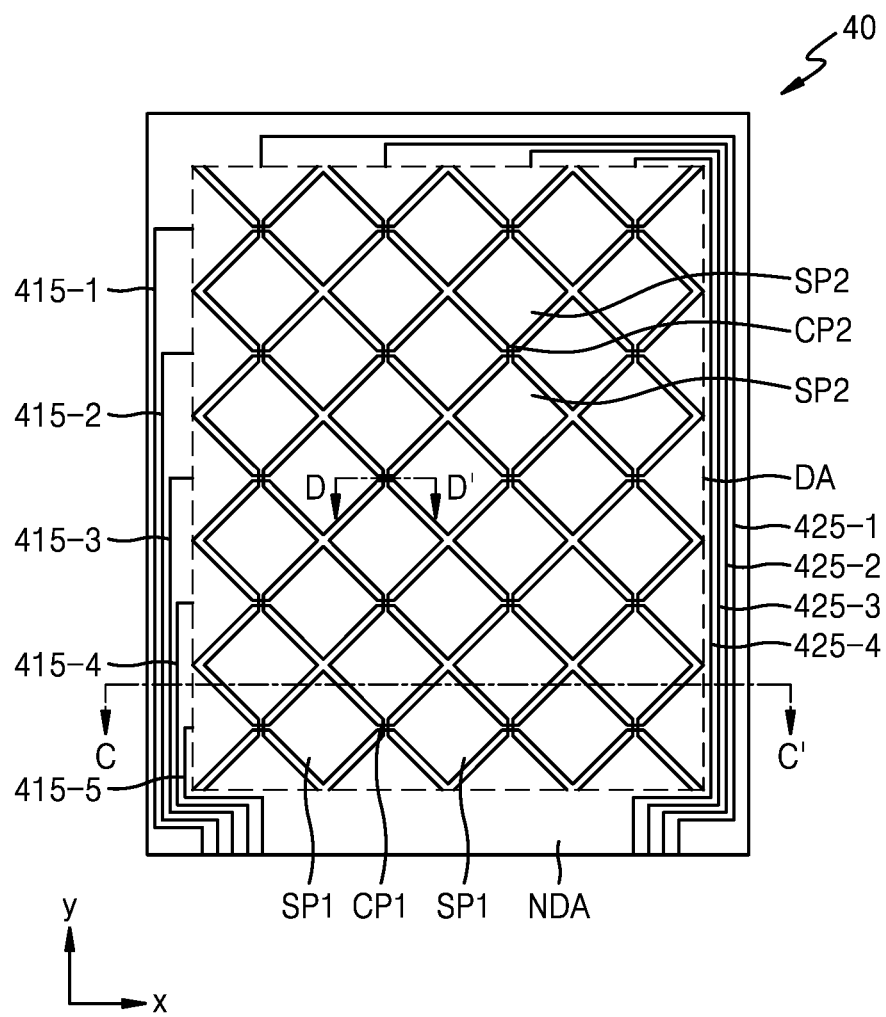
FIG. 7 is a schematic plan view illustrating an input sensing member according to an embodiment.

FIG. 7 is a schematic plan view illustrating the input sensing member 40 according to an embodiment of the present disclosure.

Referring to FIG. 7, the input sensing member 40 may include first sensing electrodes SP1, first trace lines 415-1, 415-2, 415-3, 415-4, and 415-5 connected to the first sensing electrodes SP1, second sensing electrodes SP2, and second trace lines 425-1, 425-2, 425-3, and 425-4 connected to the second sensing electrodes SP2.

The first sensing electrodes SP1 and the second sensing electrodes SP2 are located in the display area DA. The first trace lines 415-1, 415-2, 415-3, 415-4, and 415-5 and the second trace lines 425-1, 425-2, 425-3, and 425-4 are located in the non-display area NDA.

The first sensing electrodes SP1 may be arranged in an x-direction. The neighboring first sensing electrodes SP1 may be connected to each other by a first connection electrode CP1, and the first sensing electrodes SP1 connected by the first connection electrode CP1 may form a row. As shown in FIG. 7, the first sensing electrodes SP1 may form a plurality of rows, and each row may be connected to corresponding first trace lines 415-1, 415-2, 415-3, 415-4, and 415-5.

The second sensing electrodes SP2 may be arranged in a y-direction intersecting with the x-direction. The neighboring second sensing electrodes SP2 may be connected to each other by a second connection electrode CP2, and the second sensing electrodes SP2 connected by the second connection electrode CP2 may form a column. As shown in FIG. 7, the second sensing electrodes SP2 may form a plurality of columns, and each column may be connected to corresponding second trace lines 425-1, 425-2, 425-3, and 425-4.

Figure 8:
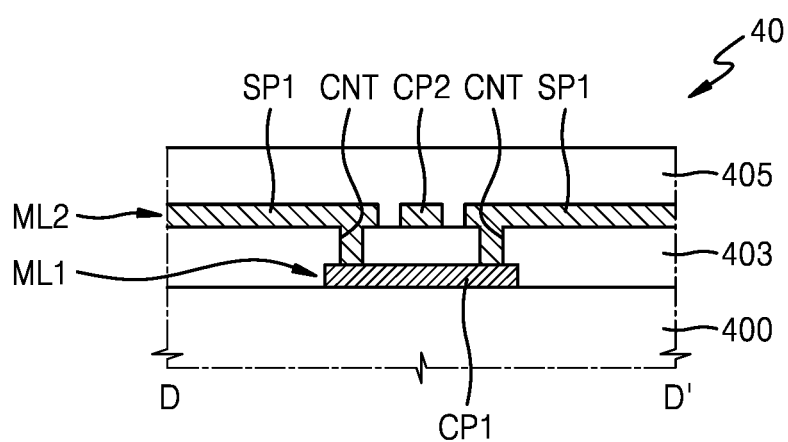
FIG. 8 is a cross-sectional view of an input sensing member according to an embodiment.
Figure 9:
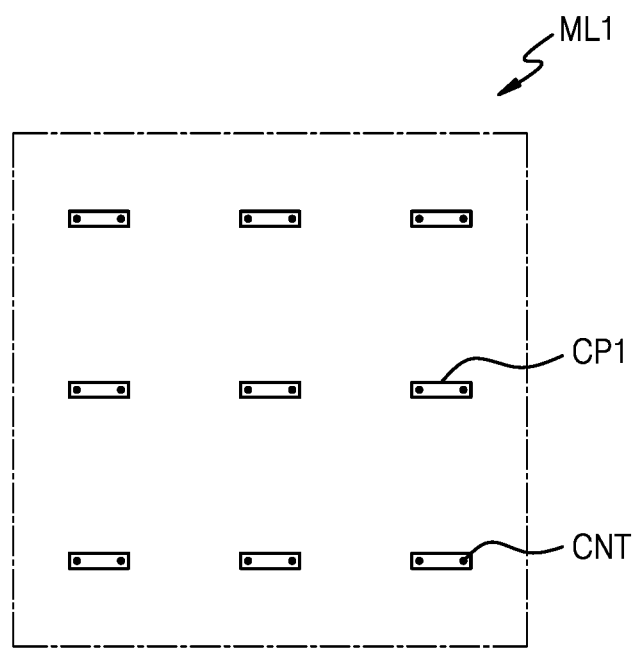
FIG. 9 is a plan view illustrating a first electrode layer of an input sensing member according to an embodiment.

FIG. 8 is a cross-sectional view of the input sensing member 40 according to an embodiment of the present disclosure, taken along the line D-D' of FIG. 7; FIG. 9 is a plan view illustrating a first electrode layer of an input sensing member according to an embodiment of the present disclosure; and FIG. 10 is a plan view illustrating a second electrode layer of an input sensing member according to an embodiment of the present disclosure.

Figure 10:
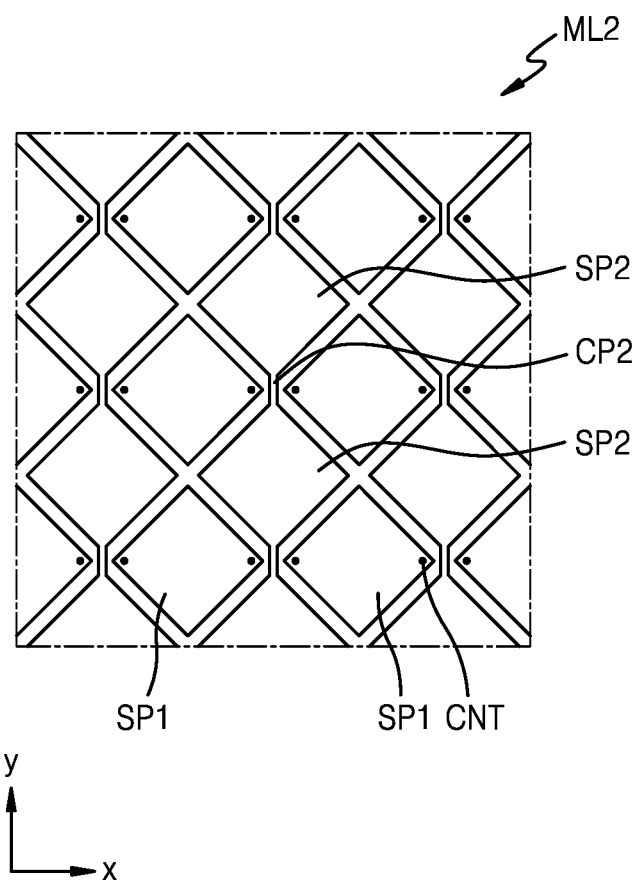
FIG. 10 is a plan view illustrating a second electrode layer of an input sensing member according to an embodiment.

Referring to FIGS. 8 to 10, a first conductive layer ML1 and a second conductive layer ML2 are located on a base layer 400. In an embodiment, the base layer 400 may include a glass material or a resin material. In an embodiment, for example, the base layer 400 may include a glass substrate including $SiO_2$ as a main component.

The first conductive layer ML1 may be located on the base layer 400 and may be directly in contact with an upper surface of the base layer 400. The first conductive layer ML1 may include the first connection electrode CP1, as shown in FIG. 9.

The second conductive layer ML2 may be located on the first conductive layer ML1 with a first insulating layer 403 between the first conductive layer ML1 and the second conductive layer ML2. The second conductive layer ML2 may be covered by a second insulating layer 405. The first insulating layer 403 and the second insulating layer 405 may include an inorganic material, an organic material, or a composite material.

The second conductive layer ML2 may include the first sensing electrodes SP1, the second sensing electrodes SP2, and the second connection electrode CP2, as shown in FIG. 10. The first sensing electrodes SP1 and the second sensing electrodes SP2 may be spaced apart from each other, and the neighboring second sensing electrodes SP2 may be connected to the second connection electrode CP2, which may be integrally formed with the second sensing electrodes SP2. The neighboring first sensing electrodes SP1 may be electrically connected to each other by each of the first sensing electrodes SP1 being connected to the first connection electrode CP1 through a contact hole CNT formed in the first insulating layer 403.

FIGS. 9 and 10 illustrate that, in an embodiment, the first sensing electrodes SP1 and the second sensing electrodes SP2 are provided on the same electrode layer, for example, the second conductive layer ML2. In another embodiment, the first sensing electrodes SP1 may be included in the first conductive layer ML1 and the second sensing electrodes SP2 may be included in the second conductive layer ML2. In addition, the first conductive layer ML1 and/or the second conductive layer ML2 may further include an auxiliary sensing electrode corresponding to the above-mentioned first sensing electrodes SP1 or the second sensing electrodes SP2 and electrically connected to the first sensing electrodes SP1 or the second sensing electrodes SP2 through the contact hole CNT of the first insulating layer 403. In addition, the first conductive layer ML1 and/or the second conductive layer ML2 may further include a dummy sensing electrode electrically insulated from the first sensing electrodes SP1 or the second sensing electrodes SP2.

The first conductive layer ML1 and the second conductive layer ML2 may include a metal layer and/or a transparent conductive layer and may be a single layer or a multilayer including the above-mentioned material. In an embodiment, the metal layer may include any of Mo, Ag, Ti, Cu, Al, and alloys thereof. The transparent conductive layer may include a transparent conductive oxide, such as any of an ITO, an IZO, an ZnO, and an indium tin zinc oxide (ITZO). In addition, the transparent conductive layer may include a conductive polymer such as PEDOT, a metal nanowire, graphene, or the like.

Figure 11:
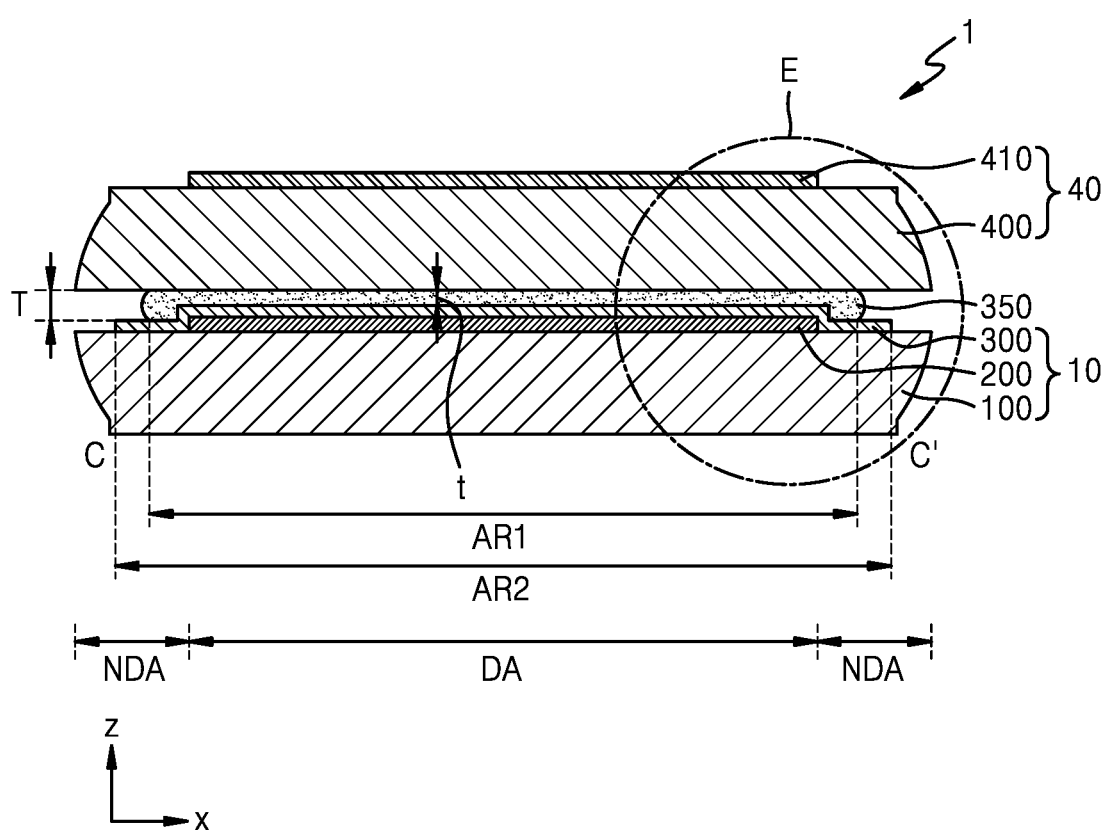
FIG. 11 is a cross-sectional view of a display apparatus according to an embodiment.
Figure 12:
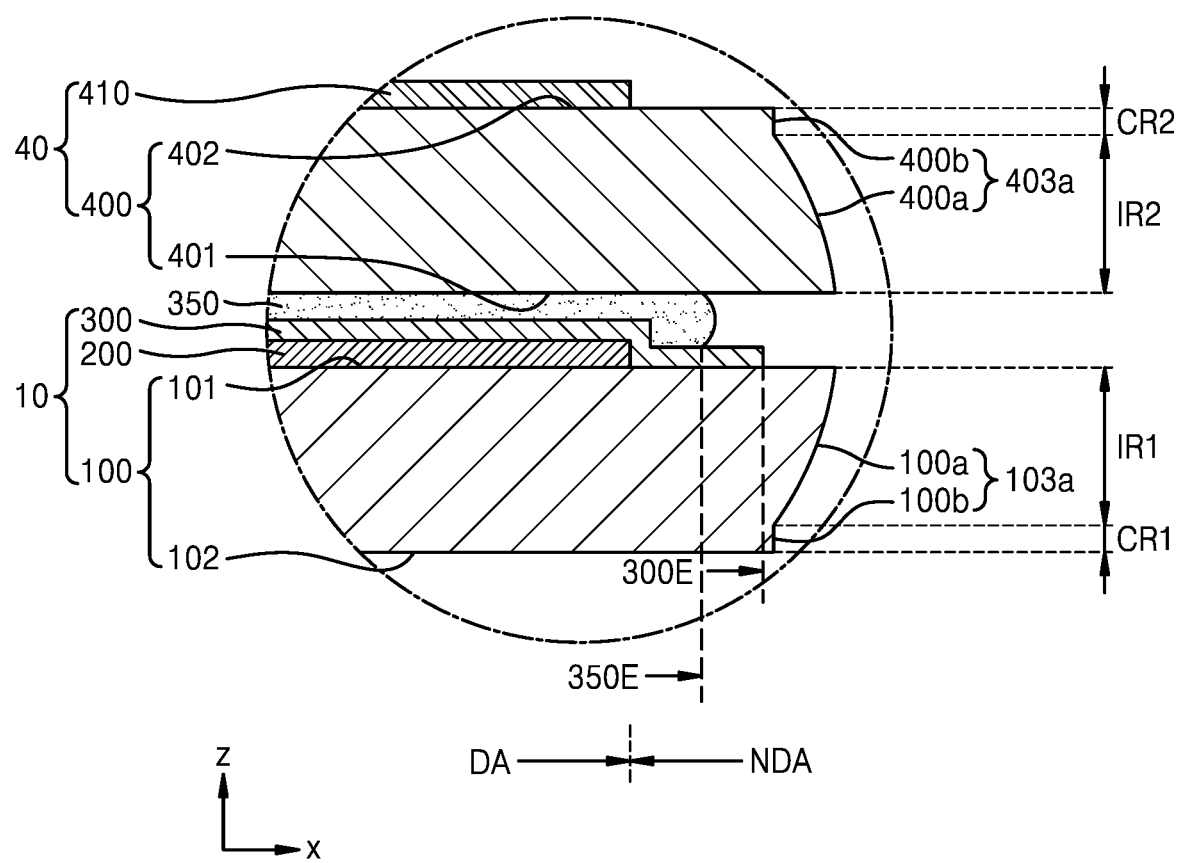
FIG. 12 is an enlarged cross-sectional view of a region "E" of FIG. 11.

FIG. 11 is a cross-sectional view of the display apparatus 1 according to an embodiment of the present disclosure; and FIG. 12 is an enlarged cross-sectional view of a region "E" of FIG. 11. The cross-sectional view of FIG. 11 corresponds to a cross-sectional view taken along the line C-C' respectively shown in FIGS. 4 and 7.

Referring to FIGS. 11 and 12, the display apparatus 1 may include the display panel 10 and the input sensing member 40. A display layer 200 including a plurality of pixels and the thin-film encapsulation layer 300 covering the display layer 200 are located on the substrate 100 of the display panel 10. The substrate 100 may include a first inner surface 101 on which the display layer 200 is located and a first outer surface 102 opposite the first inner surface 101.

The input sensing member 40 may be located above the display panel 10. The base layer 400 of the input sensing member 40 may face and overlap the substrate 100 of the display panel 10. The base layer 400 includes a second inner surface 401 facing the first inner surface 101 and a second outer surface 402 opposite the second inner surface 401. A sensor layer 410 including sensing electrodes may be located on the second outer surface 402 of the base layer 400, and the sensor layer 410 may include the first conductive layer ML1 and the second conductive layer ML2 described with reference to FIGS. 9 and 10. The sensor layer 410 may also include the first insulating layer 403 and the second insulating layer 405 located above and below the first conductive layer ML1 and the second conductive layer ML2 described with reference to FIG. 8.

A resin layer 350, for example, an optically clear resin (OCR), may be between the display panel 10 and the input sensing member 40. The resin layer 350 is distinguished from a film-type adhesive having a constant thickness. The resin layer 350 may include a photocurable resin, such as a UV curable resin. In an embodiment, the resin layer 350 may include an acrylic resin, for example, an acrylic ester-based material.

The resin layer 350 may have different thicknesses in each area. For example, the thickness of a portion of the resin layer 350 corresponding to the display area DA may be less than the thickness of another portion of the resin layer 350 corresponding to the non-display area NDA. Accordingly, FIG. 11 illustrates that a first thickness t of a first portion of the resin layer 350 corresponding to the display area DA is less than a second thickness T of a second portion of the resin layer 350 of the non-display area NDA, for example, the resin layer 350 corresponding to the non-display area NDA.

Ends of the resin layer 350 may be located further inside than ends of the thin-film encapsulation layer 300. For example, as shown in FIGS. 11 and 12, the resin layer 350 may be located further inside than an end 300E of the thin-film encapsulation layer 300. For example, the end 300E of the thin-film encapsulation layer 300 may protrude more than an end 350E of the resin layer 350 in a direction away from the display area DA. At least a portion of the resin layer 350 may protrude toward an end of the substrate 100. For example, a center portion of the resin layer 350 in a height direction (or a thickness direction) may further protrude toward the end of the substrate 100 as compared with other portions of the resin layer 350. In this case, a side surface of the resin layer 350 may be roundly formed.

As described above, the thin-film encapsulation layer 300 may include at least one inorganic encapsulation layer and at least one organic encapsulation layer. At least one of the at least one inorganic encapsulation layer of the thin-film encapsulation layer 300 may be directly in contact with the substrate 100 to be located on the substrate 100. In an embodiment, a separate layer may not be between the substrate 100 and the inorganic encapsulation layer of the thin-film encapsulation layer 300 at an end portion of the thin-film encapsulation layer 300. In this case, the first inorganic encapsulation layer (not shown) of the thin-film encapsulation layer 300 described in FIG. 6 may be stacked above the substrate 100 and the second inorganic encapsulation layer (not shown) may be stacked above the first inorganic encapsulation layer. In another embodiment, a portion of the first inorganic encapsulation layer may be stacked above the substrate 100, the second inorganic encapsulation layer may be located on an upper surface of the first inorganic encapsulation layer, and a portion of the second inorganic encapsulation layer may also be stacked above the substrate 100 while surrounding an end of the first inorganic encapsulation layer.

As described above, when the substrate 100 and the inorganic encapsulation layers are in direct contact with each other, a bonding between the substrate 100 and the inorganic encapsulation layers may be made rigid. In particular, as will be described later, when an impact is applied to at least one of the base layer 400 and the substrate 100, such as a case in which an end portion of the base layer 400 is cut and a case in which an end portion of the substrate 100 is cut, the thin-film encapsulation layer 300 and the substrate 100 may be separated from each other. In particular, when a metal wiring or the like is located below the thin-film encapsulation layer 300, the metal wiring and the thin-film encapsulation layer 300 may be separated from each other by the above-mentioned impact since the bonding force between the metal wiring and the thin-film encapsulation layer 300 is weak. However, as described above, when the inorganic encapsulation layers of the thin-film encapsulation layer 300 and the substrate 100 are in contact with each other at the end portion of the thin-film encapsulation layer 300, the thin-film encapsulation layer 300 and the substrate 100 may be prevented or substantially prevented from being separated from each other due to an external impact or the like.

In an embodiment, an end of the side surface of the resin layer 350 and the end of the thin-film encapsulation layer 300 may be located closer to the display area DA than an end of the base layer 400 and the end of the substrate 100.

The input sensing member 40 may be formed after a process of forming the display panel 10 and a process of forming the resin layer 350 on the display panel 10. For example, the input sensing member 40 may be manufactured by locating the base layer 400 on the resin layer 350 and forming the sensor layer 410 on the base layer 400. During the process of forming the input sensing member 40, for example, a process of curing the resin layer 350 before a process of forming the sensor layer 410 may be included.

After forming a plurality of units including the display panel 10 and the input sensing member 40 in a mother substrate, each of the plurality of units may be cut to manufacture the display apparatus. A cut surface, for example, a portion of side surfaces of the substrate 100 and a portion of side surfaces of the base layer 400 may respectively include a straight portion and a curved portion.

The substrate 100 may be formed in any of various forms. For example, the end of the substrate 100 may be formed in a straight line form in a direction (z-direction) from the first outer surface 102 to the first inner surface 101. In another embodiment, as shown in FIG. 12, the substrate 100 may include a first constant portion CR1 having a constant width and a first increased portion IR1 having an increased width along the direction (z-direction) from the first outer surface 102 to the first inner surface 101. Here, the width indicates a length in an x-direction. Herein, for convenience of explanation, a case in which a width of the substrate 100 is different in the thickness direction (z-direction) of the substrate 100 will now be described in further detail.

A first side surface 103a connecting the first inner surface 101 to the first outer surface 102 may include a plurality of sub-side surfaces and may include a first increased side surface 100a adjacent to the first inner surface 101 and a first constant side surface 100b adjacent to the first outer surface 102. The first increased side surface 100a may include a curved surface as a side surface of the first increased portion IR1 of the substrate 100. The first constant side surface 100b may include a surface substantially perpendicular to the first outer surface 102 as a side surface of the first constant portion CR1 of the substrate 100.

Similarly, the end of the base layer 400 may be formed in any of various shapes. In an embodiment, the end of the base layer 400 may be in a straight line form in the thickness direction (-z-direction). In another embodiment, the end of the base layer 400 may be formed to be similar to the end of the substrate 100 described above. Herein, for convenience of explanation, a case in which a width of the base layer 400 is formed to be similar to the end of the substrate 100 will now be described in further detail.

The base layer 400 may include a second constant portion CR2 having a constant width and a second increased portion IR2 having an increased width in the direction (-z-direction) from the second outer surface 402 to the second inner surface 401. A second side surface 403a connecting the second inner surface 401 to the second outer surface 402 may include a plurality of sub-side surfaces and may include a second increased side surface 400a adjacent to the second inner surface 401 and a second constant side surface 400b adjacent to the second outer surface 402. The second increased side surface 400a may include a curved surface as a side surface of the second increased portion IR2 of the base layer 400. The second constant side surface 400b may include a surface substantially perpendicular to the second outer surface 402 as a side surface of the second constant portion CR2 of the base layer 400.

With respect to the thickness (in the z-direction) of the substrate 100, the first increased portion IR1 may occupy a portion relatively larger than a portion occupied by the first constant portion CR1. For example, with respect to the thickness (in the z-direction) of the substrate 100, the portion occupied by the first constant portion CR1 may be equal to or less than half of the portion occupied by the first increased portion IR1. Similarly, with respect to the thickness (in the -z-direction) of the base layer 400, the second increased portion IR2 may occupy a portion relatively larger than a portion occupied by the second constant portion CR2. For example, with respect to the thickness (in the -z-direction) of the base layer 400, the portion occupied by the second constant portion CR2 may be equal to or less than half of the portion occupied by the second increased portion IR2.

As shown in FIG. 11, the display apparatus 1 may have a generally convex shape on the side surface of a portion corresponding to the non-display area NDA. When the side surface of the display apparatus 1 has the convex shape, the probability of being damaged by the external impact may be greatly reduced as compared with a case in which the side surface of the display apparatus 1 has a flat shape perpendicular to the first outer surface 102 of the substrate 100 or the second outer surface 402 of the base layer 400. Since the side surface of the display apparatus 1 may substantially have a convex shape having the same effect as an arc structure, impact resistance may be improved, particularly strength against side impacts. Therefore, a display apparatus having excellent impact resistance may be realized.

It is to be understood that the shape of the side surface of the display apparatus 1 described with reference to FIGS. 11 and 12 is a side surface of a portion corresponding to the edge of the display panel 10 (for example, a long side and a short side of the display panel 10) described with reference to FIG. 4.

Figure 13:
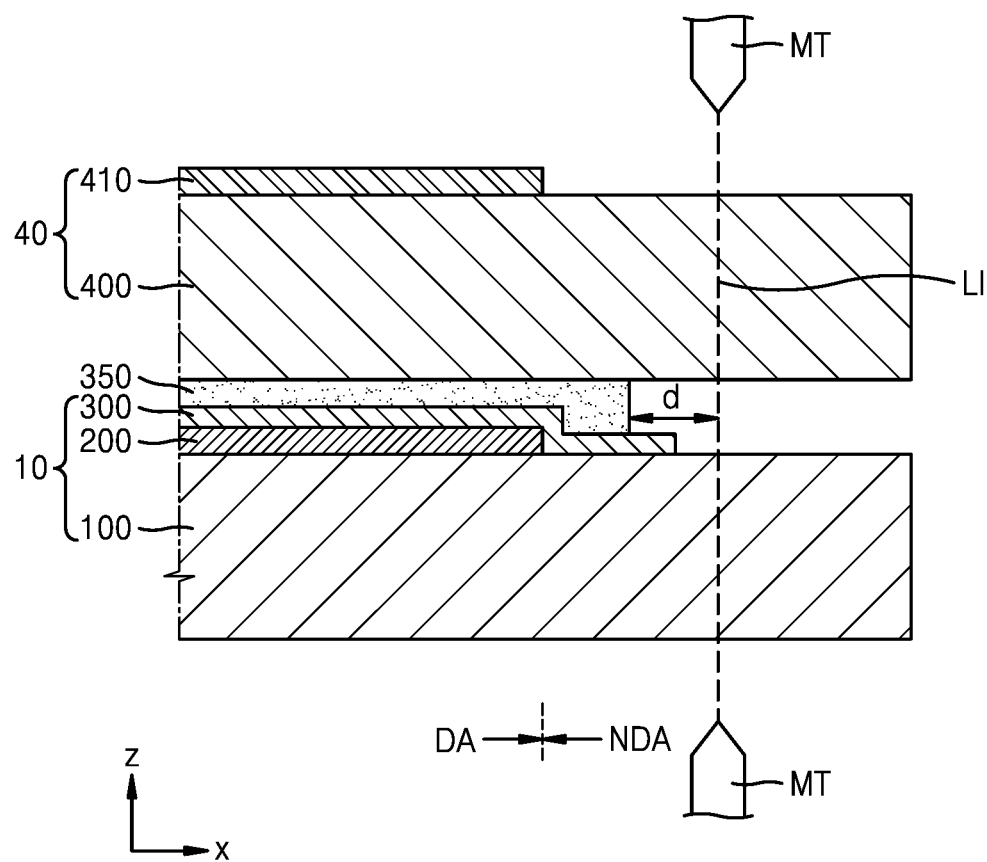
FIG. 13 is a cross-sectional view of a process of manufacturing a display apparatus, according to an embodiment.

FIG. 13 is a cross-sectional view of a process of manufacturing a display apparatus according to an embodiment of the present disclosure.

Referring to FIG. 13, various methods may be used in manufacturing a display apparatus (not shown). In an embodiment, the display layer 200 and the thin-film encapsulation layer 300 may be formed on the substrate 100 in order and then a material forming the resin layer 350 may be applied on the thin-film encapsulation layer 300. Herein, the base layer 400 may be formed or located on the resin layer 350 and then the resin layer 350 may be cured (e.g., UV-cured), and the sensor layer 410 may be formed on the base layer 400.

Next, the base layer 400 and the substrate 100 may be concurrently (e.g., simultaneously) cut by using a tool MT. The cutting by using the tool MT may be performed along a line which does not pass through the resin layer 350. For example, as shown in FIG. 13, a line LI may be spaced apart from the side surface of the resin layer 350 toward the outside by a first distance d. In an embodiment, the tool MT may include a laser, a cutting wheel, or the like. Herein, for convenience of explanation, a case in which the tool MT is a cutting wheel will be described in further detail.

A line (e.g., a predetermined line) may be formed on the substrate 100 and the base layer 400 located above the line LI by using the tool MT, and a portion outside the above-described line (e.g., predetermined line) may be separated by hitting the portion by using the tool MT. When the first distance d is not ensured, problems such as a crack of the substrate 100 and/or the base layer 400 or lifting of the display layer 200 from the substrate 100 may be caused due to a force applied during the manufacturing of the display apparatus, and a foreign substance (e.g., sludge) generated in a polishing process may be sandwiched between the substrate 100 and the base layer 400. Herein, although not illustrated in FIG. 13, a separate tool may be used to polish a side surface of the primarily cut display apparatus, for example, the side surfaces of the substrate 100 and the base layer 400. The tool may rotate in place in a state of a side surface of the tool in contact with the side of the display apparatus. In this case, edges of the substrate 100 and edges of the base layer 400 may be chamfered. In another embodiment, some of the edge of the substrate 100 and the edge of the base layer 400 may be rounded.

Figure 14:
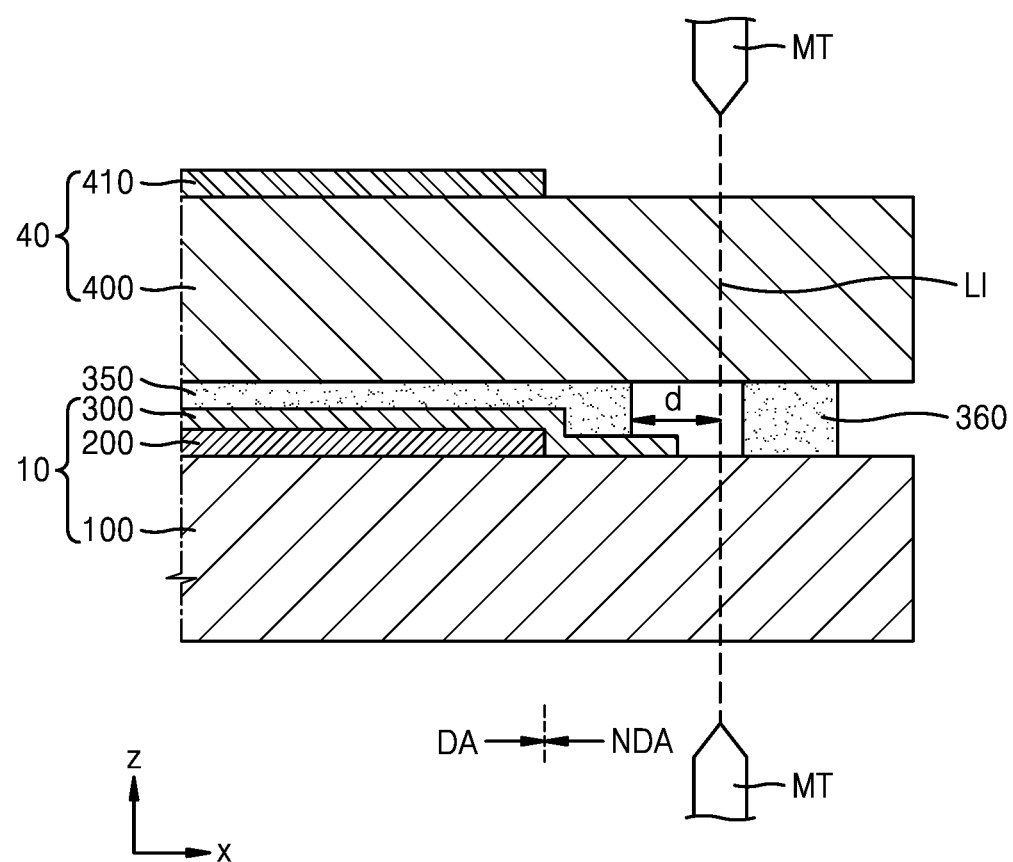
FIG. 14 is a cross-sectional view of a process of manufacturing a display apparatus, according to another embodiment.

FIG. 14 is a cross-sectional view of a process of manufacturing a display apparatus according to another embodiment of the present disclosure.

Referring to FIG. 14, a dummy resin layer 360 may be located outside the resin layer 350 in a manufacturing process in addition to the method of FIG. 13. The dummy resin layer 360 may be spaced apart from the resin layer 350 by a certain distance and a cutting process may be performed between the resin layer 350 and the dummy resin layer 360. The presence of the dummy resin layer 360 may prevent or substantially prevent the display layer 200 from being lifted or a crack from being generated due to the force applied during manufacturing the display apparatus.

As described above, when the base layer 400 and the substrate 100 are cut by using the tool MT, the base layer 400 and the substrate 100 may be transformed to separate the thin-film encapsulation layer 300 and the substrate 100. In particular, in the above-mentioned case, the resin layer 350 may not be located along the line LI, and the end of the resin layer 350 may be located inside the line LI such that only the base layer 400 and the substrate 100 may be located along the line LI, and, thereby, the base layer 400 and the substrate 100 may be bent due to a large external force applied to the substrate 100. The thin-film encapsulation layer 300 and the substrate 100 may be separated from each other in the non-display area NDA due to the transformation of the base layer 400 and the substrate 100. However, as described above, the inorganic encapsulation layers of the thin-film encapsulation layer 300 may be in direct contact with and connected to the substrate 100 in the non-display area NDA and the inorganic encapsulation layers of the thin-film encapsulation layer 300 may have a similar property to the substrate 100, and, thereby, the substrate 100 and the thin-film encapsulation layer 300 may be prevented or substantially prevented from being separated from each other due to the transformation of the substrate 100.

Figure 15:
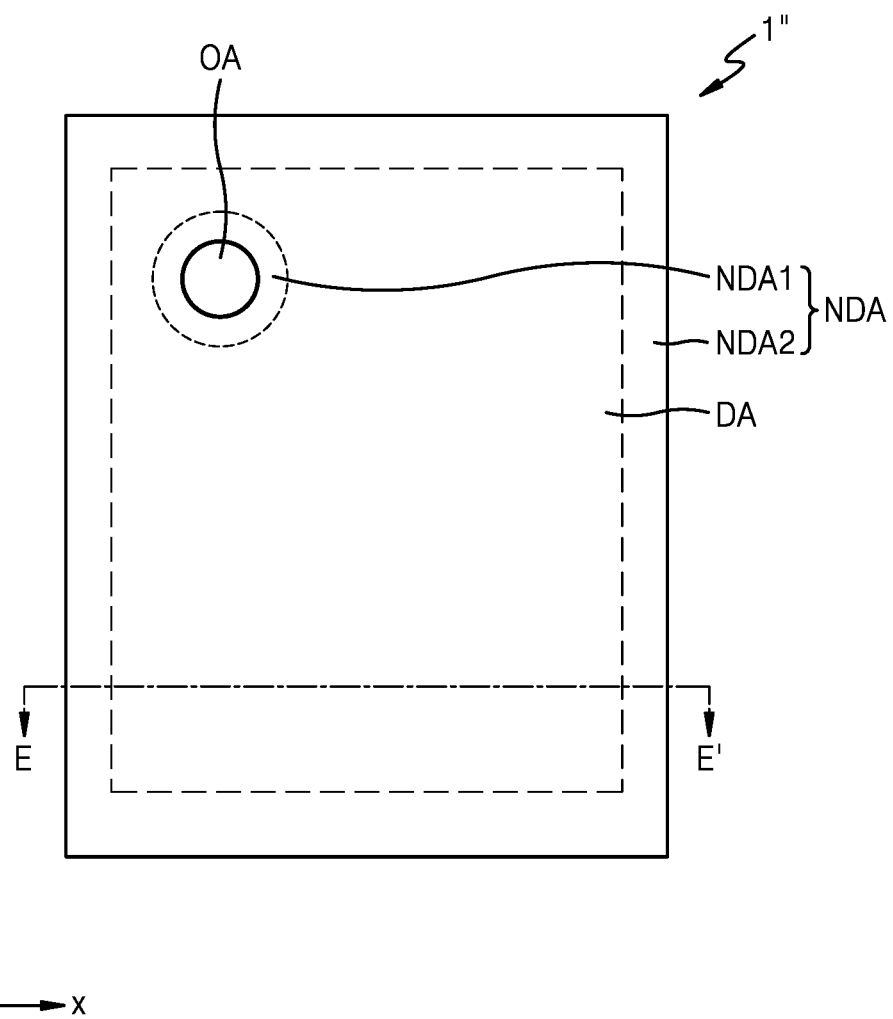
FIG. 15 is a schematic plan view illustrating a display apparatus according to another embodiment.
Figure 16:
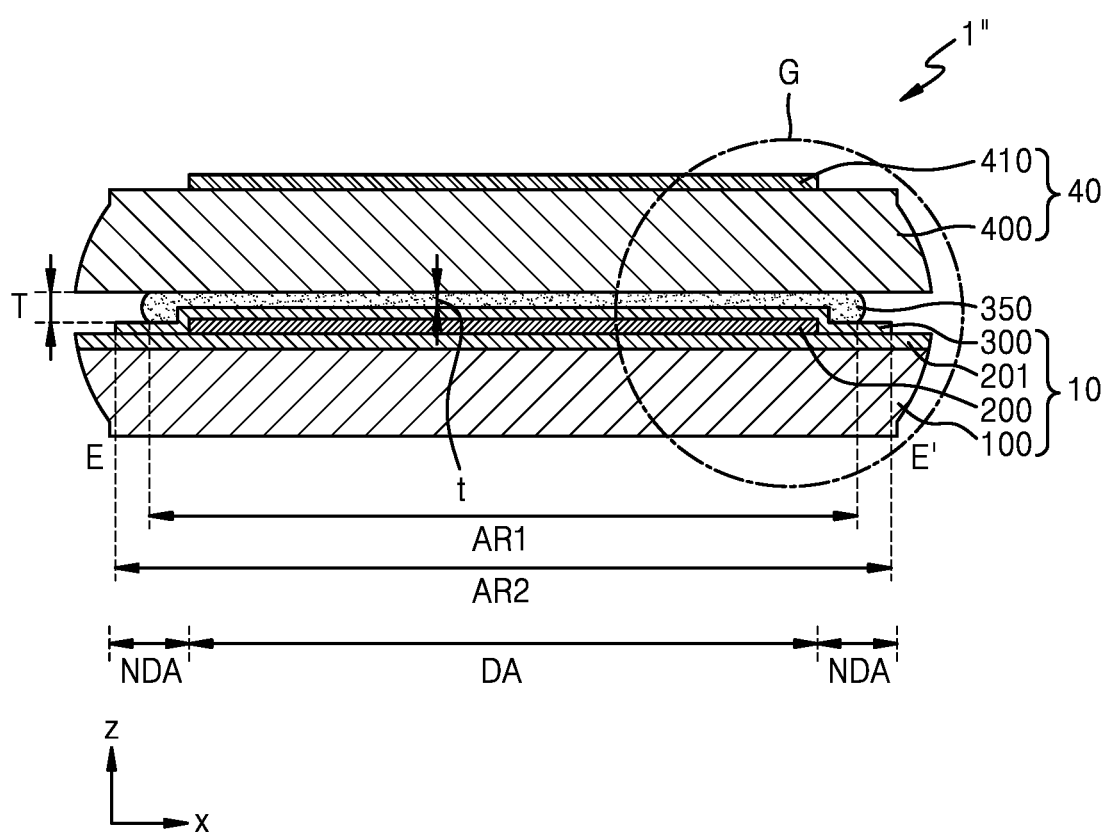
FIG. 16 is a cross-sectional view of the display apparatus of FIG. 15.

FIG. 15 is a schematic plan view illustrating a display apparatus 1″ according to another embodiment of the present disclosure; FIG. 16 is a cross-sectional view of the display apparatus 1″ of FIG. 15; and FIG. 17 is an enlarged cross-sectional view of a region "G" of FIG. 16.

Figure 17:
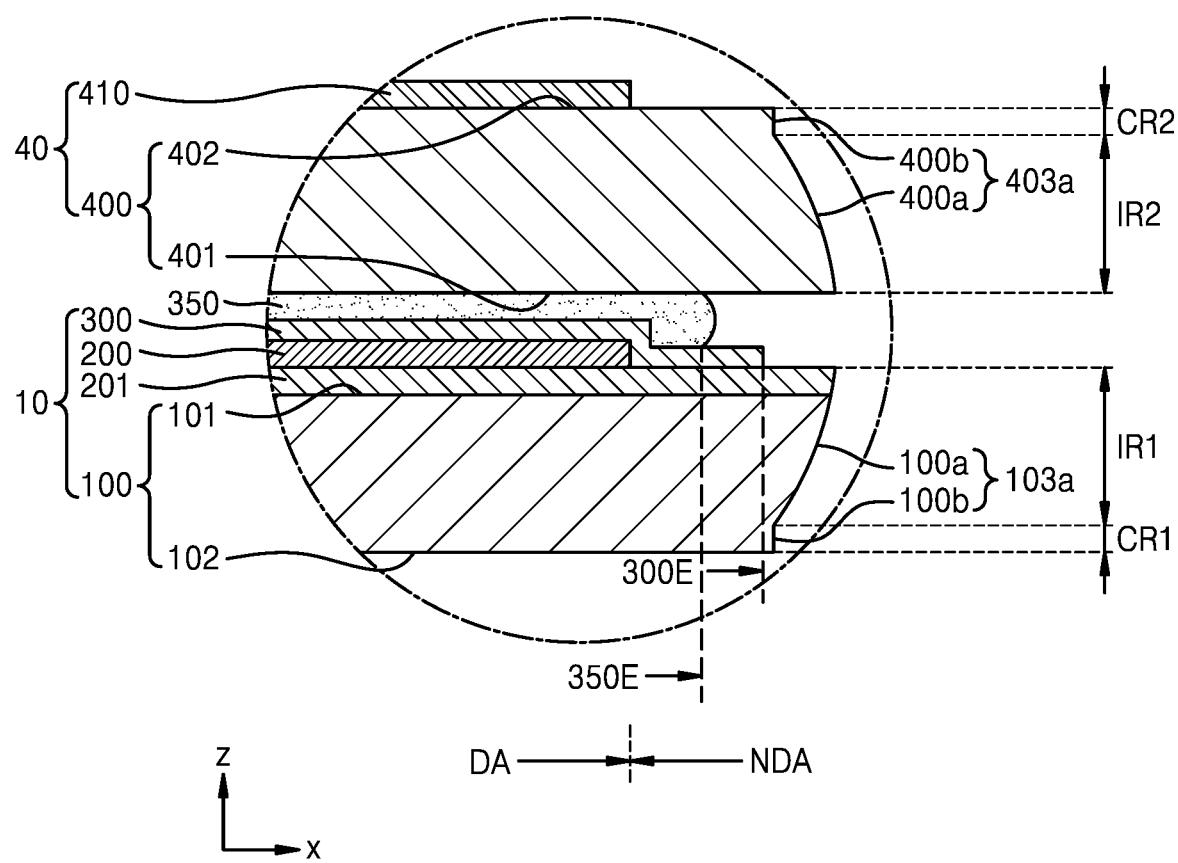
FIG. 17 is an enlarged cross-sectional view of a region "G" of FIG. 16.

Referring to FIGS. 15 to 17, an opening area OA of the display apparatus 1″ may be located inside the display area DA. In an embodiment, a first non-display area NDA1 and a second non-display area NDA2 may be separated from each other and the opening area OA may be entirely surrounded by the display area DA.

Like the display apparatus 1 described above, the display apparatus 1″ may include the display panel 10 and the input sensing member 40.

In an embodiment, the display panel 10 and the input sensing member 40 may each include an opening corresponding to the opening area OA. Each of the opening of the display panel 10 and the opening of the input sensing member 40 may be located in the opening area and may overlap each other. The opening of the display panel 10 may be in the form of a hole or a groove and the opening of the input sensing member 40 may be in the form of a hole.

The opening area OA may be a type of component area where a component configured to add various functions to the display apparatus 1″ is located. The component may include an electronic element. The component may be an electronic element using light or sound. For example, the electronic element may include a sensor outputting and/or receiving light, such as an infrared sensor, a camera capturing an image by receiving light, a sensor outputting and sensing light or sound to measure a distance or recognize a fingerprint, a small lamp outputting light, a speaker outputting sound, or the like. An electronic element using light may use light of a particular wavelength, such as any of visible light, infrared light, and ultraviolet light. In an embodiment, the opening area OA may be understood as a transmission area through which light and/or sound output from the component to the outside or from the outside toward the electronic element may pass.

When the display apparatus 1″ is an apparatus providing specific information, such as a smartwatch or an instrument panel for vehicles, the component may be a member such as a needle indicating certain information (for example, speed of a vehicle, amount of fuel, time, or the like). In addition, the component may include any of components such as a lamp or an accessory which increase certain aesthetics of the display apparatus 1″.

The display apparatus 1″ may include the display panel 10, the input sensing member 40, and the optical functional member 50 as described in FIG. 3, in addition to the display apparatus 1″ mentioned above. The optical functional member (not shown) may include an opening corresponding to the opening area OA. In this case, each of the opening of the display panel 10, the opening of the input sensing member 40, and the opening of the optical functional member (not shown) may be located in the opening area OA and overlap each other. The opening of the display panel 10 and the opening of the input sensing member 40 may be the same or similar to the above descriptions, and the opening of the optical functional member may be in a form of a hole.

Herein, for convenience of explanation, a case in which the display apparatus 1″ includes the display panel 10 and the input sensing member 40 will be described in further detail.

As described above, the resin layer 350 may be between the display panel 10 and the input sensing member 40. The resin layer 350 may be located on the thin-film encapsulation layer 300 of the display panel 10. In an embodiment, the resin layer 350 may be located in the same manner as described above.

The buffer layer 201 may be located above the substrate 100. The buffer layer 201 may be located in any of various forms. In an embodiment, for example, the buffer layer 201 may be located only above a portion of the substrate 100 where the display layer 200 is located. In another embodiment, the buffer layer 201 may be located above an entire area of the substrate 100 on which the thin-film encapsulation layer 300 is located in addition to the portion where the display layer 200 is located. In another embodiment, the buffer layer 201 may be located above a front surface of the substrate 100. Herein, for convenience of explanation, a case in which the buffer layer 201 is located above the entire area of the substrate 100 will be described in further detail.

In the above-mentioned case, the inorganic encapsulation layer of the thin-film encapsulation layer 300 may be located above the buffer layer 201 in the second non-display area NDA2. In an embodiment, the inorganic encapsulation layer of the thin-film encapsulation layer 300 may be in direct contact with the buffer layer 201 in the second non-display area NDA2. In an embodiment, the inorganic encapsulation layer of the thin-film encapsulation layer 300 may be in direct contact with the silicon nitride ($SiN_x$) or the silicon oxide ($SiO_x$) in the buffer layer 201.

As described above, the display apparatus 1″ may have a portion of the base layer 400 and a portion of the substrate 100 removed through a tool (not shown). In an embodiment, as shown in FIG. 13, the display layer 200 and the thin-film encapsulation layer 300 may be formed above the substrate 100 and then the resin layer 350 may be located on the thin-film encapsulation layer 300 and the base layer 400 may be located on the resin layer 350. The resin layer 350 may then be cured and the sensor layer 410 may be located on the base layer 400.

Next, the base layer 400 and the substrate 100 may be cut by the above-mentioned tool MT, as shown in FIG. 13. In another embodiment, as shown in FIG. 14, a portion of the base layer 400 and a portion of the substrate 100 may be cut by using the tool MT after forming the dummy resin layer 360.

In the above-mentioned case, the thin-film encapsulation layer 300 may not be separated from the buffer layer 201 even when the substrate 100 is deformed by the inorganic encapsulation layer of the thin-film encapsulation layer being coupled to the buffer layer 201 in the second non-display area NDA2. In particular, as described above, the buffer layer 201 may include an inorganic layer, such as silicon nitride or silicon oxide, and the inorganic encapsulation layer of the thin-film encapsulation layer 300 may be directly coupled to the inorganic layer of the buffer layer 201. In an embodiment, the inorganic encapsulation layer of the thin-film encapsulation layer 300 and the inorganic layer of the buffer layer 201 have similar properties to each other, such that the coupling strength between the inorganic encapsulation layer of the thin-film encapsulation layer 300 and the inorganic layer of the buffer layer 201 may be increased.

Accordingly, the display apparatus 1″ may prevent or substantially prevent the thin-film encapsulation layer 300 from being separated from the substrate when the base layer 400 is cut by the tool, thereby preventing or substantially preventing the life of an organic light-emitting element from being shortened.

The display apparatus 1″ may reduce the percentage of defects generated by the thin-film encapsulation layer 300 being separated from the substrate 100.

The display apparatus according to the embodiments of the present disclosure may prevent or substantially prevent the thin-film encapsulation layer from being separated from the substrate when the base layer is cut by the tool, thereby preventing or substantially preventing the life of an organic light-emitting element from being shortened.

The display apparatus of the present disclosure may reduce the percentage of defects generated by the thin-film encapsulation layer being separated from the substrate 100.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
 a display panel comprising a substrate, a display layer on the substrate, and a thin-film encapsulation layer covering the display layer;
 an input sensing member comprising a base layer facing the substrate of the display panel, and sensing electrodes above the base layer; and
 a resin layer between the thin-film encapsulation layer and the base layer,
 wherein an end of the thin-film encapsulation layer protrudes from an end of the resin layer toward an end of the substrate, and the end of the resin layer has a thickness greater than a thickness of a portion of the resin layer overlapping the display layer, and
 wherein, in a plan view as seen along a direction intersecting an upper surface of the base layer, an area of the base layer is greater than an area of the thin-film encapsulation layer, and the area of the thin film encapsulation layer is greater than an area of the resin layer.

2. The display apparatus of claim 1, wherein the thin-film encapsulation layer comprises at least one inorganic encapsulation layer and at least one organic encapsulation layer.

3. The display apparatus of claim 2, wherein an end of the at least one inorganic encapsulation layer protrudes from the resin layer toward the end of the substrate.

4. The display apparatus of claim 1, wherein the end of the thin-film encapsulation layer is in direct contact with the substrate.

5. The display apparatus of claim 1, wherein the display layer comprises a buffer layer between the substrate and the thin-film encapsulation layer.

6. The display apparatus of claim 5, wherein the buffer layer comprises at least one of silicon oxide and silicon nitride, and
 the end of the thin-film encapsulation layer is in direct contact with the at least one of silicon oxide and silicon nitride.

7. The display apparatus of claim 1, wherein the end of the thin-film encapsulation layer is closer to the resin layer than the end of the substrate.

8. The display apparatus of claim 1, wherein the substrate and the base layer comprise glass.

9. The display apparatus of claim 1, wherein a side surface of the resin layer is curved.

10. A display apparatus comprising:
a display panel comprising a substrate, a display layer on the substrate, and a thin-film encapsulation layer covering the display layer;
an input sensing member comprising a base layer facing the substrate of the display panel, and sensing electrodes above the base layer; and
a resin layer between the thin-film encapsulation layer and the base layer,
wherein the resin layer exposes a portion of a surface of the thin-film encapsulation layer facing the base layer, and an end of the resin layer has a thickness greater than a thickness of a portion of the resin layer overlapping the display layer, and
wherein, in a plan view as seen along a direction intersecting an upper surface of the base layer, an area of the base layer is greater than an area of the thin-film encapsulation layer, and the area of the thin film encapsulation layer is greater than an area of the resin layer.

11. The display apparatus of claim 10, wherein, in the plan view, an area of the resin layer is less than the area of the thin-film encapsulation layer.

12. The display apparatus of claim 10, wherein, in the plan view, the resin layer is located inside an edge of the thin-film encapsulation layer.

13. The display apparatus of claim 10, wherein an end of the thin-film encapsulation layer is in direct contact with the substrate.

14. The display apparatus of claim 10, wherein the display layer comprises a buffer layer between the substrate and the thin-film encapsulation layer.

15. The display apparatus of claim 14, wherein the buffer layer comprises at least one of silicon oxide and silicon nitride, and
an end of the thin-film encapsulation layer is in direct contact with the at least one of silicon oxide and silicon nitride.

16. The display apparatus of claim 10, wherein the substrate and the base layer comprise glass.

17. The display apparatus of claim 10, wherein a portion of a side surface of the resin layer between the substrate and the base layer protrudes away from the display layer.

18. The display apparatus of claim 10, wherein the thin-film encapsulation layer comprises at least one inorganic encapsulation layer and at least one organic encapsulation layer.

19. A display apparatus comprising:
a display panel comprising a substrate, the substrate comprising a display area around an opening area, a display layer on the substrate, and a thin-film encapsulation layer covering the display layer;
an input sensing member comprising a base layer facing the substrate of the display panel, and sensing electrodes above the base layer; and
a resin layer between the thin-film encapsulation layer and the base layer,
wherein an end of the thin-film encapsulation layer protrudes from an end of the resin layer toward an end of the substrate, and the end of the resin layer has a thickness greater than a thickness of a portion of the resin layer overlapping the display layer, and
wherein, in a plan view as seen along a direction intersecting an upper surface of the base layer, an area of the base layer is greater than an area of the thin-film encapsulation layer, and the area of the thin film encapsulation layer is greater than an area of the resin layer.

* * * * *